United States Patent [19]

Larson et al.

[11] Patent Number: 5,751,936
[45] Date of Patent: May 12, 1998

[54] CHECKING FOR PROPER LOCATIONS OF STORAGE DEVICES IN A STORAGE DEVICE ARRAY

[75] Inventors: David Larson, Broomfield; Robert E. Stubbs; Gene Edstrom, both of Longmont, all of Colo.

[73] Assignee: Fujitsu Limited, Kanagawa, Japan

[21] Appl. No.: 645,124

[22] Filed: May 13, 1996

Related U.S. Application Data

[63] Continuation of Ser. No. 325,989, Oct. 19, 1994, Pat. No. 5,598,528, which is a continuation of Ser. No. 794,114, Nov. 15, 1991, Pat. No. 5,369,758.

[51] Int. Cl.$^6$ .............................. G06F 11/28; G06F 11/30
[52] U.S. Cl. ........................ 395/182.05; 395/183.12; 395/183.18; 711/114
[58] Field of Search .................... 395/441, 182.05, 395/183.18, 183.12, 183.13

[56] References Cited

U.S. PATENT DOCUMENTS

| | | | |
|---|---|---|---|
| 3,914,747 | 10/1975 | Barnes et al. | 711/206 |
| 4,779,189 | 10/1988 | Legvold | 711/166 |
| 4,924,331 | 5/1990 | Robinson et al. | 360/72.1 |
| 4,935,825 | 6/1990 | Worrell et al. | 360/54 |
| 5,051,887 | 9/1991 | Berger et al. | 711/162 |
| 5,101,492 | 3/1992 | Schultz et al. | 395/182.05 |
| 5,208,813 | 5/1993 | Stallmo | 395/182.05 |
| 5,233,618 | 8/1993 | Glider et al. | 371/68.1 |
| 5,325,497 | 6/1994 | Jaffe et al. | 711/114 |

*Primary Examiner*—Eddie P. Chan
*Assistant Examiner*—Reginald G. Bragdon
*Attorney, Agent, or Firm*—Sheridan Ross P.C.

[57] ABSTRACT

A determination is made as to whether or not storage devices of a storage array are positioned in their proper physical locations in the array. To make the determination, a device identifier for each of the storage devices is utilized, together with a generated logical identifier. In a preferred embodiment, the device identifier is the serial number for the storage device and the logical identifier includes a combination of all the device identifiers for a particular logical volume of the storage array. Preferably, the logical identifier also includes system status information for use in enhancing fault tolerance. The logical identifier is written or updated upon the occurrence of predetermined events or conditions. Using the device identifiers and the logical identifier, an indication can be provided whenever the proper storage devices are not found in the logical volume whereby corrective action can be taken to avoid improper distribution to or reassembly of data from the logical volume.

20 Claims, 4 Drawing Sheets

5,751,936

CHECKING FOR PROPER LOCATIONS OF STORAGE DEVICES IN A STORAGE DEVICE ARRAY

This is a continuation of application Ser. No. 08/325,989 filed Oct. 19, 1994, now U.S. Pat. No. 5,598,528 which is a continuation of Ser. No. 07/794,114, filed Nov. 15, 1991, now U.S. Pat. No. 5,369,758.

FIELD OF THE INVENTION

The present invention relates to storage device arrays and, in particular, to determining whether or not a correct storage device is positioned at the proper location in the storage device array.

BACKGROUND OF THE INVENTION

Large peripheral storage systems are advantageous for a substantial number of business and engineering software applications in one configuration of such systems, storage is accomplished by distributing the data to be stored over a number of separate storage devices that cooperate together in defining a storage device array. Such individual storage devices may include, among other devices, magnetic and optical disk drives. Such storage systems have large storage capacities. Together with a host system, they contribute to high data transmission rates. Data reliability is also achieved using a storage device array.

The large capacity is achieved by using a number of relatively inexpensive storage devices, such as 5.25 inch magnetic disk drives. The high data transmission rates are achieved by configuring the system so that the individual storage devices are grouped into one or more "logical volumes or clusters." A logical volume, even though it is comprised of a number of physically separate storage devices, appears to the host system as a single, large storage unit. The storage array typically includes hardware and software to enable all storage devices in a logical volume to be simultaneously involved in data transmission. That is, each device has a unique data connection such that a read or write to the logical volume is accomplished by means of a read or write to each device in the logical volume. This allows large amounts of data to be rapidly read from or written to the storage array. High data reliability can be achieved by utilizing hardware components and software procedures for redundantly storing data, such as the use of parity information, together with one or more extra storage devices that can be used as replacements for storage device (s) that fail. Data on a failed device can be reconstructed, using the parity information, and transferred to the replacement storage device until the failed device is replaced.

A requirement associated with storage arrays is that the order or arrangement of the correct storage devices in each logical volume must be known and maintained. The storage array uses this order or sequence of storage devices in converting between the single stream of data interpretable by the host system and the multiple parallel data streams from/to a logical volume. This ordering of storage devices allows data being retrieved from the storage array, via parallel data transfers from storage devices in a logical volume, to be converted into a single stream of information acceptable to the host system.

Since replacement of individual storage devices might be necessary, there are a number of system maintenance situations that could arise and must be accounted for. For example, a storage device that is part of one logical volume could inadvertently be placed in another logical volume, thus making unreadable the data in the one logical volume. As another example, the storage devices within a logical volume could be incorrectly permuted such that the data supplied by the devices is not received through the proper data connection and thus cannot be properly converted. More specifically, it is known to store consecutively transmitted data bytes on separate disks. For example, for fixed sized data blocks, byte 1 is stored on disk one, byte 2 is stored on disk two, byte n is stored on disk n, byte n+1 is stored on disk one and so forth. To correctly reassemble the stored data from the multiple disks, it is critical that the same disks having the distributed data be accessed. If disk two, for example, has been replaced by another disk not having the stored data of disk two, a problem occurs because the data cannot be accurately reassembled using different data from such a disk.

Similarly, if the physical locations or connections of disks one and two are switched, the data could not be accurately reassembled.

Such problems arise due to the lack of a mechanism for automatically determining if each storage device in the storage array is positioned in the correct location. It would therefore be advantageous to have a procedure by which a verification can be made that array storage devices are both logically clustered together and in the correct order within each logical volume.

SUMMARY OF THE INVENTION

The present invention is directed to method and apparatus for verifying that each storage device is in the correct physical position in a storage device array. That is, a determination is made as to whether each storage device is installed in the proper physical location for the logical volume to which it belongs. The present invention has applicability with disk drives but might be incorporated with other storage devices.

For each logical volume of storage devices, a "logical identifier" is generated and stored on each storage device. To do this, the present invention makes use of a device identifier that is uniquely and permanently associated with each storage device. The device identifier is readable from its storage device. In a preferred embodiment, the device identifier is the serial number of the storage device that is stored thereon at a known location. For a given logical volume, the logical identifier is constructed from the individual device identifiers for that volume. That is, the logical identifier for each storage device of a logical volume is the same and includes a combination of all device identifiers for that logical volume. The logical identifier also includes control information or bytes that provide information relating to the status of system operation. By way of example, when data is being reconstructed to a replacement storage device, the control bytes of the logical identifier include information indicating that such a data reconstruction is taking place. Consequently, if there should be a power loss and power is then restored, by reading the logical identifier that includes the control bytes, the system determines its state prior to the loss of power and can use that information in resuming proper operation.

With respect to checking of the logical identifier and the device identifiers for a logical volume, when predetermined events or conditions occur, such as after power restoration, the logical identifiers of all the storage devices for a logical volume are read. If all of the logical identifiers correspond to each other and there is the proper number of logical identifiers read, then the determination is made that the logical volume has the proper storage devices.

To check whether or not such storage devices are arranged correctly in the logical volume, for each storage device, a comparison is made between its own device identifier and the corresponding portion or segment of the logical identifier.

If there is correspondence, for each storage device, between the device identifier and the information found in the predetermined portion of the logical identifier it is determined that each of the device identifiers is at the correct physical location in the logical volume. If there is no correspondence, a message or error indication is generated to inform the user of this lack of correspondence.

In addition to checking for correct logical and device identifiers, the present invention also generates and/or updates the logical identifier for each volume or cluster of storage devices. Such updating or writing of the logical identifier occurs under certain predetermined conditions or events. For example, in order to maintain the state of the storage system for recovery from a power loss while reconstructing data to a replacement storage device of a particular logical volume, the logical identifier for this particular logical volume is generated by reading each of the device identifiers including the device identifier of the replacement drive. Additionally, the control bytes of the logical identifier include information to the effect that a data reconstruction to the replacement drive is occurring.

After the updated logical identifier is generated, it is written to each of the storage devices for that particular logical volume. It should be understood that other events or conditions can initiate the writing or updating of a logical identifier including system operations or commands during which it is important to keep track of the status thereof.

Based on the foregoing summary, a number of salient features of the present invention are readily discerned. A check is made to determine whether correct storage devices, such as disk drives and their accompanying disk(s), are in proper locations after a predetermined condition or event has occurred, such as power being restored. If the correct storage devices are not in their proper physical locations for a particular logical volume, there is a message generated indicating that this fault has occurred. Additionally, the ability to update or write a new logical identifier for a logical volume is available so that, depending upon the occurrence of certain events and/or conditions, e.g., replacement of a storage device, an updated and correct logical identifier is stored on each of the storage devices. Each logical identifier includes a combination of storage device identifiers and control bits providing information concerning the operation of the overall system. If power is lost and then restored, a check can be made of the logical identifier for a particular logical volume in determining the state of the system when power was lost. In this way, fault tolerance in connection with the storage device array is further enhanced.

Additional advantages of the present invention will become readily apparent from the following discussions particularly when taken together in conjunction with the accompanying drawings.

DETAILED DESCRIPTION

Figure 1:
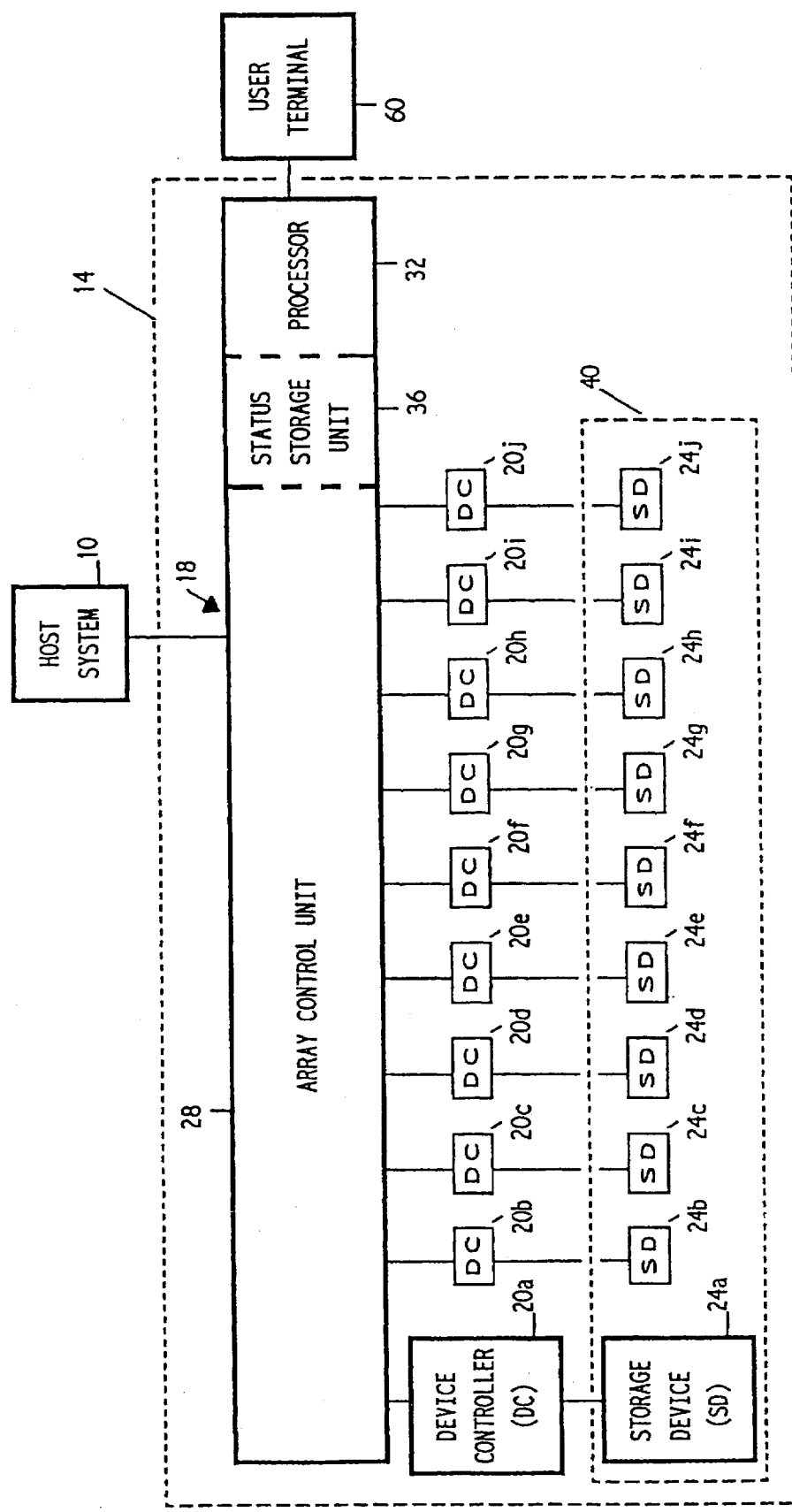
FIG. 1 is a block diagram illustrating basic hardware components utilized in the present invention.

Referring to FIG. 1, a system block diagram is illustrated for implementing the present invention. The system includes a host system 10 that transmits and receives data from an array storage system 14 over a data connection having a certain bandwidth. For example, the bandwidth might be four bytes, and the data block size 4096 bytes, with the data transferred at 36 MB/s. The host system 10 can include any one of a number of computational devices that have computers for generating and/or requiring data from the array storage system 14. For example, the host system 10 might include extremely large capacity optical storage units, together with processing or computing units, where such a host system 10 wishes to utilize the capabilities of a storage device array. Alternatively, the host system 10 could be a distributed computer network where requests for reading and writing of data to and from the array storage system 14 come from various computers with network access.

FIG. 1 illustrates that the array storage system 14 is comprised of a number of apparatuses: an array control module or unit (ACM) 18, a plurality of device controllers 20a–20j and a corresponding number of storage devices 24a–24j. The array control module 18 has responsibility for overall control of the array storage system 14. In particular, the array control module 18 controls the distribution and reassembly of data between the storage devices 24 and the host system 10. Each device controller 20a–20j controls the reading and writing of data to the respective storage device 24a–24j to which it is connected. That is, a device controller 20a–20j determines the exact physical locations for the data on its respective storage device 24a–24j. The storage devices 24a–24j store the data that is written for subsequent use by the host system 10. In one embodiment, each storage device is a disk drive, including one or more disks, such as 5.25 inch magnetic disk drives, although other storage devices could make up the storage device array.

The ACM 18 includes an array control unit 28 that has, among other things, the responsibility for converting data to and from the data format used by the host system 10. In one embodiment, the host system 10 transmits and receives, in parallel fashion, a data block of 4K bytes over a four parallel connections and the ACM 18 converts that data to 8 blocks of 512 bytes. The data is sent in parallel to each of the device controllers 20a–20h. For example, a first data byte is sent to device controller 20a and a second data byte is sent to device controller 20b. With regard to the illustrated embodiment of FIG. 1, device controller 20i communicates with the storage device 24i, which stores parity data generated from the data on storage devices 24a–24h. Device controller 20j communicates with the storage device 24j, which acts as a spare storage device and is utilized when one of the other storage devices fails. The ACM 18 also includes a processor 32 that provides the computational ability to monitor and control the state of the entire array storage system 14. A status storage unit 36 is also part of the ACM 18 and stores status information associated with the array storage system 14 during system operation.

As an example of the operation of the ACM 18, consider a host system 10 request to write data to the array storage system 14. The write request is made to a control process executed by processor 32. This process queries the status storage unit 36 to determine if the array storage system 14 is in an appropriate state to allow a write request to be executed. If the process grants the write request, then data is written by the host system 10 to the array control unit 28. Status information indicating a write is in process is written to the status storage unit 36. The data residing in the array control unit 28 is then converted into the desired data format for distribution to the device controllers 20. The control process executing on processor 32 then sends write commands to the appropriate device controllers 20. Each such device controller 20 proceeds to write the data allocated to it to the proper storage device 24. Subsequently, a message is sent to the control process indicating the completion of the write operation. A read operation is conducted similarly but with the ACM 18 reassembling the data read from the appropriate storage devices 24 for transmission in the proper data format to the host system 10.

In FIG. 1, a single logical volume 40 is illustrated.

The logical volume 40 has predetermined physical locations assigned to the storage devices 24a–24j which are known to the appropriate device controllers 20a–20j. A data write to the array storage system 14 writes data only to the logical volume 40. Other embodiments of the array storage system 14 include multiple logical volumes. In such a case, each device controller 20a–20j controls more than one storage device. In such embodiments, the device controllers 20 determine which logical volume is to be involved in a read or write. It should also be understood that the number of storage devices 24 in a logical volume can vary. The data distribution capability of the array control module 18 is dependent upon the number of storage devices 24 locations per logical volume. In the illustrated embodiment, eight data storage devices 24a–24h are illustrated, together with a parity storage device 24i and a spare storage device 24j. Fewer or greater data storage devices could be utilized. Relatedly, more than one parity storage device could be included as well as more than one spare storage device.

In another embodiment, a second array storage system 14 is provided. In accordance with this embodiment, the host system 10 is able to write to and/or read from a logical volume using both array storage systems 14. Additionally, if a fault should occur in connection with accessing a particular logical volume using device controllers of the first array storage system, the second array storage system can be utilized to attempt to access the same storage devices of that logical volume.

It should also be noted that the organization of the data on the storage devices 24 may vary substantially. In one embodiment, consecutive bytes within a fixed size block of data from the host system 10 may be distributed to two or more different device controllers and thus are written on two or more different storage devices. In this data organization, one embodiment has the host system 10 transmitting data blocks of 4096 bytes. This block is then distributed using a logical volume that has ten storage devices 24a–24j. Eight of these storage devices 24a–24h store data in blocks of approximately 512 bytes, with the first storage device 24a storing the first, ninth, seventeenth, etc., bytes of the 4096 bytes. The ninth storage device 24i stores redundant information that allows data reconstruction in the case where one of the storage devices 24 or device controllers 20 connected to the logical volume 40 fails. In a preferred embodiment, the redundant information is in the form of parity bytes generated using the stored data. The tenth storage device 24j is used as a spare storage device. The tenth storage device 24j is an extra device that is used to store reconstructed data from some other failing storage device 24 for the logical volume 40. In a second data organization, a host system 10 data block may be distributed into fixed size subblocks of consecutive bytes. Each subblock is written to a storage device within a logical volume.

Certain situations can occur using the array storage system 14 where data integrity is jeopardized. In particular, one or more of the storage devices 24 of logical volume 40 is in an incorrect physical position. In one case, a logical volume of storage devices 24 is installed using the correct locations for that particular logical volume; however, two of the storage devices 24 are at two incorrect: physical positions in that volume, e.g., they have been inadvertently switched. Secondly, an incorrect storage device 24 has been installed in the logical volume 40.

To determine whether or not a logical volume has all of the storage devices in their proper positions, the present invention utilizes previously stored and subsequently determined information. The previously stored information includes a "device identifier" for each of the storage devices 24. The device identifier is a unique and permanent identifying code for each of the storage devices 24. Preferably, the device identifier is the serial number for the particular storage device. The determined information includes a "logical identifier" for each logical volume 40. In a preferred embodiment, each of the storage devices 24 of the logical volume 40 has the same logical identifier. This logical identifier includes the device identifiers for each of the storage devices 24 of the particular logical volume 40. For example, in the case of ten storage devices, the logical identifier includes the serial numbers of the storage devices 24 for all of the storage devices 24 in that logical volume 40. The logical identifier preferably also includes control information bytes that indicate status associated with the operation of the array storage system 14. The generation and use of the logical identifier for the logical volume 40, together with use of the device identifiers, will be described in greater detail later.

In addition to checking for correct storage devices 24 in a logical volume 40, the present invention also incorporates fault tolerant procedures by utilizing the logical identifier of each logical volume 40, particularly by means of the control information bytes. Briefly, this is accomplished by updating or writing a logical identifier for a logical volume 40 whenever certain situations arise or conditions occur.

Figure 2:
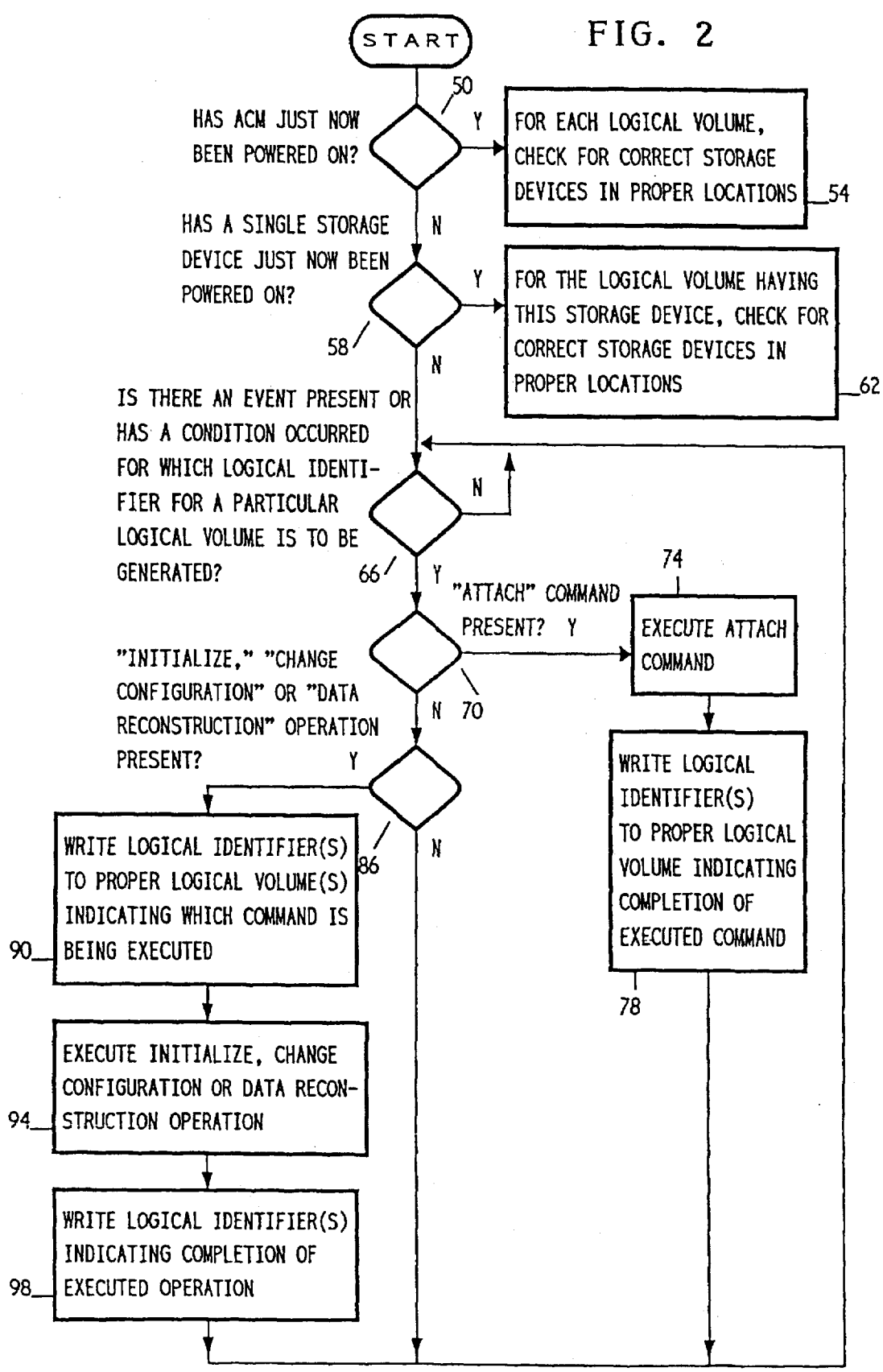
FIG. 2 is a flow diagram illustrating steps associated with the initiating of the reading of logical and device identifiers or the writing of a logical identifier.

With respect to a discussion of situations that initiate the determination as to whether or not the correct storage devices 24 are found and arranged properly in the logical volume 40 or whether or not the logical identifier is to be updated and written to each of the storage devices 24 for a particular logical volume 40, reference is now made to FIG. 2.

Figure 3:
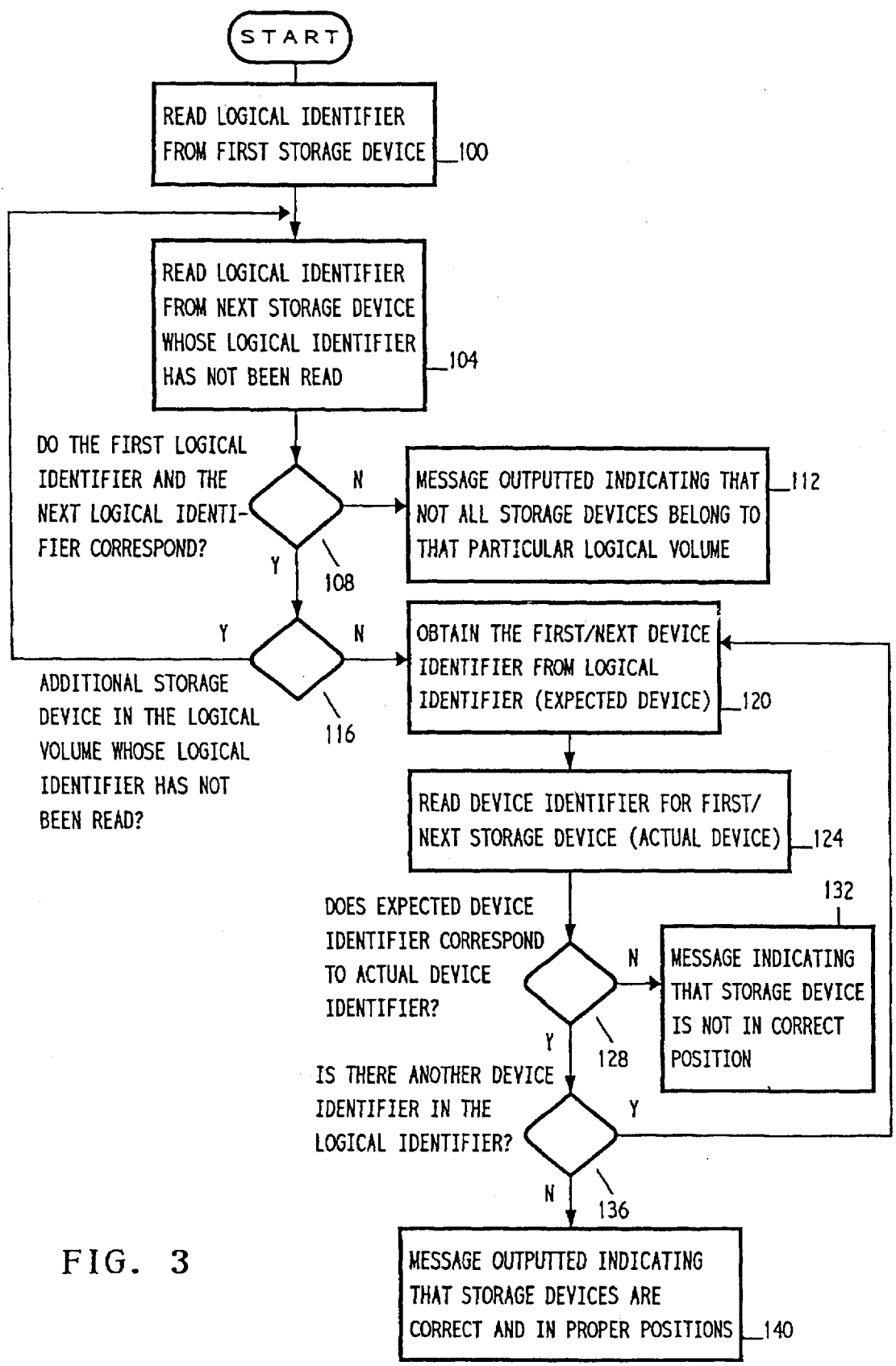
FIG. 3 is a flow diagram illustrating steps associated with the checking or reading of logical and device identifiers.

Referring first to step 50, a particular event is monitored, namely, determining whether the ACM 18 has just now been powered on. Based on the occurrence of this event, a decision is made to check whether or not any of the storage devices 24a–24j of the logical volume 40 may have been: (1) removed or made unusable so that there are not enough usable storage devices 24 for the logical volume 40; (2) placed in the wrong logical volume; and (3) placed in the proper logical volume 40 but connected at an incorrect position within that particular logical volume 40. In accordance with step 54, each logical volume of the array storage system 14 is checked using the steps illustrated in FIG. 3. The steps of FIG. 3 will be described in greater detail later. Similar to step 50, at step 58 a check is made as to whether a single storage device has just been powered on. If so, as indicated by step 62, the steps of FIG. 3 are also executed. Continuing with the steps of FIG. 2, other conditions will be detected for which a logical identifier will be generated or updated. Generally speaking, step 66 monitors any number of array storage system situations or events that may affect data integrity and for which it is advantageous to write a logical identifier. In the preferred embodiment, certain situations have been identified and implemented for monitoring and taking predetermined action. These events or situations are: (1) issuance of an "attach" command; and (2) the presence of an "initialize," "change configuration" or "data reconstruction" operation. These may be initiated by a user interacting with the array storage system 14 by way of a user input device, e.g., terminal 60.

Figure 4:
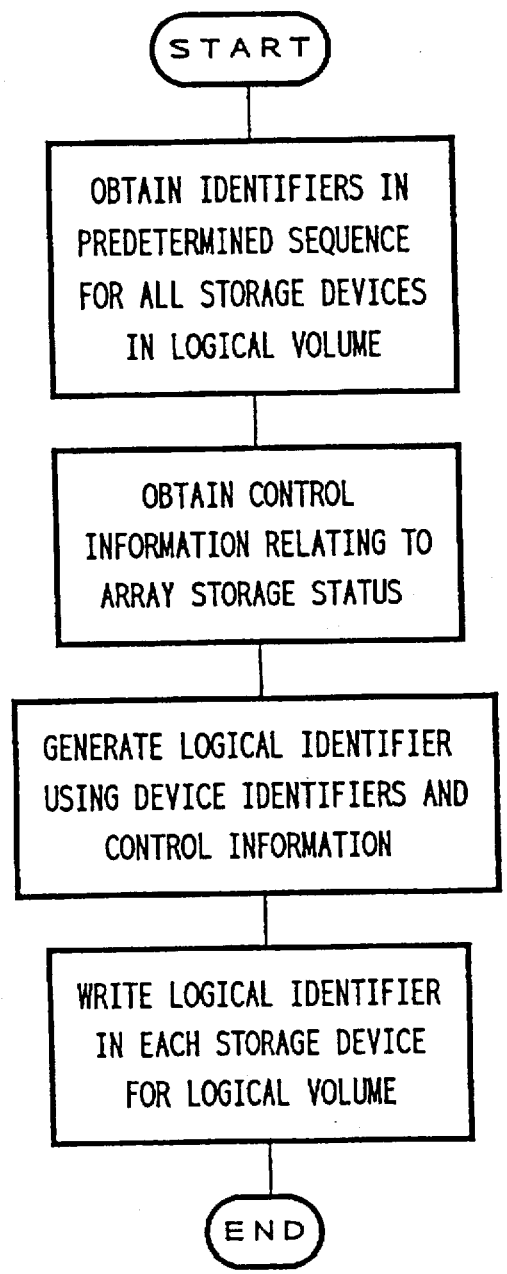
FIG. 4 is a flow diagram illustrating steps relating to the updating or writing of a logical identifier.

With respect to an attach command being issued, step 70 checks for this occurrence. In such a case at step 74 the attach command is executed. After execution of the attach command, step 78 is executed resulting in a logical identifier being written to each of the storage devices 24 for the particular logical volume 40 that is involved with the "attach" command. In writing a new logical identifier, the steps illustrated in FIG. 4 are executed. A detailed discussion of the steps of FIG. 4 will be provided later herein.

The "attach" command relates to preparing a storage device 24 for accepting and storing data. This preparation can include reading and updating track and sector defect maps. When an attach command is issued, it is indicative of the fact that a different storage device has been included with the logical volume 40. Consequently, the logical identifier must be updated in the storage devices 24 of the logical volume 40. The updated logical identifier should include the device identifier of this different storage device.

Referring now to step 86 of FIG. 2, a determination is made as to whether a particular operational event is occurring that also requires writing of a logical identifier to a particular logical volume. As step 86 indicates, a check is made as to whether or not an "initialize," "automatic data reconstruction" or "change configuration" is occurring.

The "initialize" operation is similar to an "attach" command execution in that storage devices 24a–24j are prepared for reading and writing of data by updating defect maps and allocation of data storage on the storage devices 24. However, the initialize operation relates to all storage devices of the particular logical volume. As step 90 indicates, the logical identifier is written before the execution of the initialize, as represented by step 94. This is important in the case of power failure that might occur during the execution of the initialize. That is, before the initialize, the control information of the logical identifier is updated to indicate that an initialize is to be conducted. If there should be a power failure and subsequent power restoration during the occurrence of step 94, the system will conveniently be able to determine that an initialize was being conducted at the time of the power failure. Upon restoration of power, the initialize can be re-started and completed. Without the convenient checking of this status information using the logical identifier, incorrect defect and storage allocation information could be interpreted as legitimate and improperly utilized. Upon completion of the execution of the initialize, the logical identifier for the particular logical volume is again written or updated, as indicated by step 98. The control information in the logical identifier must once again be updated to include this status information.

Referring back to step 86 in connection with the "automatic data reconstruction," it is seen that the procedure set out in FIG. 2 involves the same steps that were previously described in connection with the "initialize" operation. The automatic data reconstruction involves, for example, reconstructing data on the failed storage device to the spare storage device 24j. This is typically accomplished using the parity data stored in the storage device 24i, together with the data residing on the non-failed storage devices 24 of the same logical volume 40. Status information relating to the data reconstruction should also be retained in the logical identifier prior to the data reconstruction operation. In the event of failure associated with the array storage system 14, such as a power failure, upon power restoration, the control information in the logical identifier is read and provides information to the effect that a data reconstruction was in process. In such a case, the array storage system 14 can either immediately restart the data reconstruction operation or continue the operation depending upon the system's capability. As with the initialize, upon completion of the data reconstruction, the logical identifier for that particular logical volume 40 is again updated and written to each storage device 24 to reflect the fact that the operation has been completed. As with the initialize, the logical identifier changes because the control information is modified upon completion of the data reconstruction.

The "change configuration" operation relates to the storing of data on a replacement storage device for a storage device that has failed. In the preferred embodiment, this operation is similar to the data reconstruction operation in that all of the storage devices including the spare storage device 24j are utilized in writing the data to the replacement drive. As with the other two operations, it is advantageous to update the logical identifier both before and after execution of the operation.

Summarizing the foregoing steps of FIG. 2 relating to these three operations, step 86 determines whether one of them has been invoked. If so, step 90 causes a new logical identifier to be written to the storage device 24 of the logical volume 40 to which the operation applies. The new logical identifier contains the status information associated with that particular operation and is used during the recovery of the array storage system 14 after a failure. Such status information is found in control information bytes of the logical identifier. The steps for writing a logical identifier to each of the storage devices 24 for the particular logical volume 40 is set out in FIG. 4. Step 94 relates to the execution of the particular operation. Step 98 indicates that the logical identifier is again updated. That is, the control information bytes of the logical identifier are modified to reflect the fact that the operation has been completed.

With respect to a description of the checking of the logical and device identifiers, reference is now made to FIG. 3 for a discussion of the use of such identifiers in checking for correct storage devices 24 being properly located in a particular logical volume 40.

As previously described, a determination has been made, in accordance with the steps of FIG. 2, that an event has occurred or a condition was present for which a check should be made as to whether or not the correct storage devices 24 are found in the particular logical volume 40. In that regard, the purposes served by such a check include: (1) to determine whether there is a correct number of storage devices at the locations for the particular logical volume 40; (2) to determine whether or not all of the storage devices 24 are part of the particular logical volume 40; and (3) if so, to determine whether or not such storage devices 24 are in their correct physical positions. The following steps illustrated in FIG. 3 are implemented to achieve such purposes.

First, at step 100 the logical identifier from the first storage device 24a is read and it is stored in a storage location or register. This storage area can be defined as "logical_identifier." It should be understood that the order of the storage devices 24a–24j for the logical volume 40 corresponds to the order used when data is distributed by the ACM 18 to the logical volume 40. This must also be the same order or arrangement for the device identifiers associated with a logical identifier. That is, the device identifiers are arranged in a sequence according to the order of the storage devices 24a–24j to which they are uniquely associated.

At step 104, the logical identifier from the next storage device (e.g. 24b) is read into a storage location or register, which can be defined as "next_logical_identifier." In step 108, a determination is made as to whether the identifier information stored in the "logical_identifier" and the "next_logical_identifier" are the same. If not, then the storage devices 24a and 24b do not belong to the same logical volume 40. In such a case, in step 112, a message or return status is generated indicating that these two storage devices do not belong to the same logical volume.

If these two storage areas have the same logical identifier, step 116 determines whether there is another storage device 24 in the logical volume 40. If so, then step 104 is once again executed and a determination is made as to whether this new value stored in "next_logical_identifier" is identical to the logical identifier in the "logical identifier" storage location. If so, step 116 once again determines whether or not there is another storage device 24 whose logical identifier has not been compared with the logical identifier found in the storage location or register, which is identified as "logical_identifier." As can be understood, the foregoing procedure involves continuous looping though the steps 104, 108 and 116, wherein each logical identifier is iteratively read from the next unread storage device 24 of the logical volume 40 and a subsequent determination made as to whether the logical identifiers are all the same.

There are two exits to the above-described loop. At step 108, the result from the comparison indicates that the contents of the "logical_identifier" and the "next_logical_identifier" are not the same. In such a case, the conclusion is reached that the logical identifier of the first storage device 24a and the most recently read logical identifier are not the same. The "no" branch of step 108 is taken and, in step 112, a message or return status is generated indicating that a storage device that is physically connected as part of the logical volume 40 does not belong with this particular logical volume. At step 116, the loop terminates if there are no further unread logical identifiers to be read from storage devices 24 for the logical volume 40. In this case, all logical identifiers for these devices are identical. Additionally, because all ports or connections to the device controllers 20 for the particular logical volume 40 are also inherently checked, during the reading of the logical identifiers, the determination is also made that the number of storage devices 24 are correct. That is, if a storage device was missing, this would be determined when an attempt was made to read the logical identifier of the storage device expected to be at that position or connection. Once the logical identifiers have been compared and where they are all the same, the "no" branch of step 116 is taken so that a determination can be made as to whether the storage devices 24 are in the correct positions within the logical volume 40.

With respect to step 120, the first device identifier (e.g. for storage device 24a) is obtained from the logical identifiers and stored in a storage location or register, which can be defined as "expected_device_identifier." At step 124, the device identifier is read from the storage device 24a and stored in a storage location, which can be defined as "actual_device_identifier." In step 128, a comparison or determination is made as to whether the "expected_device_identifier" and "actual_device_identifier" stored contents are the same. If this condition is not satisfied, then this first compared storage device is not in the proper position in the logical volume 40, as specified in the logical identifier. In this case, step 132 generates a message or returns status indicating that this storage device is not in the correct position. As should be understood, in conjunction with making the comparison, inherently associated with a device identifier in the logical identifier is its position in the logical volume. That is, because the logical identifier is generated from a known sequential accessing of devices identifiers, when the first or next device identifier is read from a portion or segment of the logical identifier, this particular portion or segment corresponds to a known device storage position for the particular logical volume 40.

If the condition of step 128 is true, then step 136 determines whether or not there is another comparison to be made, i.e. whether there is another device identifier in the logical identifier.

If a "yes" decision is reached at step 136, then steps 120 and 124 are once again executed. This time, in step 120, expected_device_identifier has identifier information corresponding to the next storage device (e.g. storage device 24b). In step 124 the "actual_device_identifier" has the device identifier which is read from the second storage device of the logical volume (storage device 24b). After steps 120 and 124 are executed again, a determination is made at step 128 as to whether or not the actual and expected device identifiers are identical. If not, the message is generated at step 132 indicating the lack of correspondence between the expected information and the actual information. If step 128 establishes that there is a correspondence, then step 136 determines whether another actual device identifier needs to be compared with an expected device identifier, as found in the logical identifier. If so, the process described by steps 120, 124 and 128 is continued.

After all comparisons have been made between the actual device identifiers and the expected device identifiers, the determination is made at step 136 that all comparisons have been made and a correspondence exists between all portions of the logical identifier and the device identifiers. At step 140, an output message or return status is provided indicating that the storage devices 24 are correct and are in their proper physical positions in the logical volume 40.

In connection with the steps relating to the foregoing determination, it should be appreciated that, because the logical identifier is generated from the device identifiers, there cannot be more actual storage devices 24 than device identifiers found in the logical identifier. If such were the case, it would mean that the logical identifier was generated incorrectly because it should be generated from all device identifiers of the particular logical volume. It should also be understood that it was previously determined in steps 104, 108, 116 that the number of storage devices in the logical identifier was not more than the actual number of storage devices. That is, it was determined that the number of actual storage devices corresponded to the number of storage devices in the logical identifier. If the number of actual storage devices had been less than the number thereof found in the logical identifier, the path to step 112 would have been taken indicating an error.

Reference is now made to FIG. 4 in which steps for writing or updating a logical identifier are illustrated. As previously described, a determination has been made that an event has occurred or a condition was present for which a logical identifier is to be updated or written. Once such a determination is made, step 160 is executed. Specifically, there is an iterative reading, in accordance with a predetermined sequence, of the device identifiers in the logical volume 40 from each of the storage devices 24a–24j. This sequential reading of device identifiers results in position information, relating to the storage devices 24, to be obtained. That is, when generating a logical identifier, the device identifiers are obtained for the logical volume in a known, predetermined order. Consequently, when the logical identifier is accessed to compare the next segment or portion thereof with a device identifier, it is known as to which storage device position that segment applies to. Additionally, at step 164, the predetermined control information is read or obtained. After reading this information, at step 168, the logical identifier is generated using the device identifiers in the logical volume 40, together with control information contained in the control bytes that are also part of the logical identifier. As previously noted, the control information bytes provide the array storage system 14 with status information that can be used to assist in recovery in the event the array storage system 14 should fail. Finally, at step 172, the logical identifiers are written to each of the storage devices 24a–24j the logical volume 40. The logical identifier is written to a designated storage location on each of the storage devices 24a–24j.

The foregoing discussion of the invention, including any variations thereof, has been presented for purposes of illustration and description. It is not intended that any such embodiment be exhaustive or in any way limit the invention to the precise form disclosed, and other modifications and variations may be possible in light of the above teachings. It is intended that the appended claims be construed to include other alternative embodiments of the invention except insofar as limited by the prior art.

What is claimed is:

1. A method for determining whether each of a plurality of storage devices of a logical volume of storage devices is part of a logical volume, comprising:
   providing an identifier on each storage device of said logical volume, each of the identifiers on each of said storage devices being the same in said logical volume;
   reading out the identifiers from each of said storage devices;
   assuming the identifier read out from one of said storage devices is a reference identifier;
   comparing the reference identifier with the identifier read out from the other storage devices;
   determining whether or not an incorrect member is present in said logical volume based upon the comparison result in said comparing step; and
   updating the identifier on each of said storage devices when an event occurs which may affect data integrity, by generating a new identifier different from that already provided on said storage devices, and writing the new identifier to each of said storage devices.

2. A method, as claimed in claim 1, wherein:
   said event includes at least one of the following:
   initialization of said storage devices by updating defect maps and allocation of data storage,
   reconstruction of data for one of said storage devices, and
   a configuration change by storing data on a replacement storage device for one of said storage devices that is failed.

3. A method, as claimed in claim 1, wherein:
   the identifier includes status information comprising status related to said event.

4. A method for determining whether each of a plurality of storage devices of a logical volume of storage devices is part of a logical volume, comprising:
   providing an identifier on each storage device of said logical volume, each of the identifiers on each of said storage devices being the same in said logical volume;
   reading out the identifiers from each of said storage devices;
   assuming the identifier read out from one of said storage devices is a reference identifier;
   comparing the reference identifier with the identifier read out from the other storage devices;
   determining whether or not an incorrect member is present in said logical volume based on the comparison result in said comparing step; and
   updating the identifier on each of said storage devices, when an event occurs which may affect data integrity, by generating a new identifier different from that already provided on said storage devices and writing the new identifier to each of said storage devices, said event relates to disruption of power to at least one of said storage devices after reconstruction of data has begun associated with said storage devices.

5. A disk array apparatus connected to a plurality of storage devices of a logical volume, comprising:
   means for providing an identifier on each of said storage devices of said logical volume, each of the identifiers being the same in said logical volume;
   means for reading out the identifiers from each of said storage devices of said logical volume;
   means for assuming the identifier read out from one of said storage devices as a reference identifier;
   means for comparing the reference identifier with the identifier read out from each of the other storage devices of said logical volume;
   means for determining whether or not an incorrect member is present in said logical volume based upon the comparison result of said comparing means; and
   means for updating the identifier on each of said storage devices when an event occurs which may affect data integrity, by generating a new identifier different from that already provided on said storage devices, and writing the new identifier to each of said storage devices.

6. An apparatus, as claimed in claim 5, wherein:
   said event includes at least one of the following:
   initialization of said storage devices by updating defect maps and allocation of data storage,
   reconstruction of data from one of said storage devices, and
   a configuration change by storing data on a replacement storage device for one of said storage devices that is failed.

7. An apparatus, as claimed in claim 5, wherein:
   the identifier includes status information comprising status related to said event.

8. A disk array apparatus connected to a plurality of storage devices of a logical volume, comprising:
   means for providing an identifier on each of said storage devices, of said logical volume, each of the identifiers being the same in said logical volume;

means for reading out the identifiers from each of said storage devices of said logical volume;

means for assuming the identifier read out from one of said storage devices as a reference identifier;

means for comparing the reference identifier with the identifier read out from each of the other storage devices of said logical volume;

means for determining whether or not an incorrect member is present in said logical volume based upon the comparison result of said comparing means; and means for updating the identifier on each of said storage devices when an event occurs which may affect data integrity by generating a new identifier different from that already provided on said storage devices and writing the new identifier to each of said storage devices, said event relates to a disruption of power to one of said storage devices after reconstruction of data on said storage devices has begun.

9. A method for determining whether each of a plurality of storage devices of a logical volume of storage devices is positioned at a proper physical location, comprising:

monitoring, using processing means, occurrences of predetermined events including:

(a) initialization of said storage devices by updating defect maps and allocation of data storage.

(b) reconstruction of data for one of said storage devices, and (c) a configuration change by storing data on a replacement storage device for one of said storage devices that has failed;

obtaining information using said processing means related to said reconstruction of data;

writing identifier means using said controller means to each storage device of said logical volume of said storage devices, said identifier means including status information comprising status related to each of said predetermined events including first status related to said reconstruction of data after said obtaining step;

beginning execution of said reconstruction of data using at least one of said processing means and said controller means;

powering on at least one of said storage devices after disruption of power thereto;

reading said identifier means using said controller means for each of said storage devices after said powering on step;

determining using said processing means that each of said storage devices of said logical volume is properly located in said logical volume using said identifier means;

completing execution of said reconstruction of data using at least one of said processing means and said controller means after said determining step; and rewriting said identifier means using said controller means to each said storage device of said logical volume, said identifier means including a second status related to said reconstruction of data after said completing step.

10. A method, as claimed in claim 9 wherein:

said step of writing said identifier means includes writing said identifier means to one of said storage devices of said logical volume that is the same as said identifier means that is written to each of the other of said storage devices of said logical volume.

11. A method, as claimed in claim 9, wherein:

said rewriting said identifier means includes rewriting said identifier means to one of said storage devices of said logical volume that is the same as said identifier means that is rewritten to each of the other of said storage devices of said logical volume.

12. A method for determining whether each of a plurality of storage devices of a logical volume of storage devices is a proper member of the logical volume of storage devices, comprising:

providing an identifier on each storage device of a logical volume of storage devices, each said identifier including a device identifier that is unique to each of said storage devices of said logical volume and each said identifier including a logical identifier that includes a combination of each of said device identifiers of said storage device with said logical identifier being stored on each of said storage devices;

reading out each said identifier from each of said storage devices;

assuming said identifier read out from one of said storage devices as a reference identifier;

comparing said reference identifier with said identifier read out from the other storage devices of said logical volume; and determining whether or not an improper member of said storage devices is in said storage devices of said logical volume based upon results of said comparing step.

13. A method, as claimed in claim 12, wherein:

said step of providing includes generating said logical identifier whenever at least one of the following occurs: attaching of one of said storage devices, replacing one of said storage devices, updating defect information for one of said storage devices, reconstructing data for one of said storage devices, and changing configuration information associated with said logical volume.

14. A method, as claimed in claim 12, wherein:

said step of reading includes reading a serial number written on each of said storage devices, each of said serial numbers being used as a device identifier which is part of said identifier.

15. A method, as claimed in claim 12, wherein:

said step of comparing includes comparing said device identifier for each of said storage devices with a predetermined portion of said reference identifier.

16. A disk array apparatus connected to a plurality of storage devices of a logical volume, comprising:

means for providing an identifier on each of said storage devices of said logical volume, each said identifier including a device identifier that is unique to each of said storage devices of said logical volume and each said identifier including a logical identifier that includes a combination of each of said device identifiers of said storage devices with said logical identifier being stored on each of said storage devices;

means for reading out each said identifier from each of said storage devices of said logical volume;

means for assuming said identifier read out from one of said storage devices as a reference identifier;

means for comparing said reference identifier with each said identifier read out from each of said storage devices; and means for determining whether or not an improper member of said storage devices of said logical volume is in said storage devices of said logical volume based upon results of said means for comparing.

17. An apparatus, as claimed in claim 16, wherein:

said identifier includes control bytes that have information relating to the operation of the apparatus.

18. An apparatus, as claimed in claim 16, wherein:

each said identifier includes a serial number associated with each of said storage devices.

19. An apparatus, as claimed in claim 16, wherein:

said means for determining determines whether each of said storage devices of said logical volume has the same logical identifier.

20. An apparatus, as claimed in claim 16, wherein:

said means for comparing compares each of said device identifiers with a predetermined portion of said reference identifier.

* * * * *